(12) United States Patent
Ku et al.

(10) Patent No.: US 8,935,651 B1
(45) Date of Patent: Jan. 13, 2015

(54) METHODS AND APPARATUS FOR DATA PATH CLUSTER OPTIMIZATION

(75) Inventors: Tsuwei Ku, Cupertino, CA (US); Samir Agrawal, Sunnyvale, CA (US); Jean-Charles Giomi, Menlo Park, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 1258 days.

(21) Appl. No.: 11/966,790

(22) Filed: Dec. 28, 2007

(51) Int. Cl.
*G06F 9/455* (2006.01)
*G06F 17/50* (2006.01)

(52) U.S. Cl.
USPC ........... 716/132; 716/107; 716/133; 716/134; 716/135

(58) Field of Classification Search
CPC .............. G06F 17/5045; G06F 17/505; G06F 17/5068; G06F 17/5072; G06F 2217/84; G06F 17/5031; G06F 17/5077; G06F 7/501
USPC .................. 716/1, 2, 18, 107, 132–135; 712/1
See application file for complete search history.

(56) References Cited

U.S. PATENT DOCUMENTS

| | | | |
|---|---|---|---|
| 5,519,627 A * | 5/1996 | Mahmood et al. | 716/18 |
| 5,726,902 A * | 3/1998 | Mahmood et al. | 716/6 |
| 5,841,663 A * | 11/1998 | Sharma et al. | 716/104 |
| 6,305,006 B1 * | 10/2001 | Markov | 716/102 |
| 7,373,618 B1 * | 5/2008 | Khoo et al. | 716/103 |
| 7,590,964 B1 * | 9/2009 | Petkov et al. | 716/18 |
| 2002/0059553 A1 * | 5/2002 | Eng | 716/4 |
| 2003/0101429 A1 * | 5/2003 | Okada | 716/18 |

OTHER PUBLICATIONS

Introduction to Multithreading, Superthreading, and Hyperthreading, by Jon "Hannibal" Stokes, http://www.ic.unicamp.br/~cortes/mo601/artigos_referencias/MultiThreading_stokes.pdf, Oct. 2, 2002.*
"An Accurate Exploration of Timing and Area Trade-Offs in Arithmetic Optimization using carry Adder Cells", by Young-Tae Kim, and Taewhan Kim, @IEEE 2000.*
Koren, "Computer Arithmetic Algorithms" Prentice Hall, 1993. pp. 79-84.
Parhami, B. "Compter Arithmetic: Algorithms and Hardware," Oxford University Press, 2000. p. 120, 151-153.
Paulin,P.; Knight,J. "Force-Directed Scheduling for the Behavioral Synthesis of ASIC's" IEEE Transactions on Computer-Aided Design, Jun. 1989, pp. 661-679.
Aho, A.; Sethi,R.; Ullman,J. "Compilers Principles, Techniques and Tools" 1988, Addison Wesley. pp. 291, 528-603, 633-637, 733-745.

(Continued)

*Primary Examiner* — Nha Nguyen
(74) *Attorney, Agent, or Firm* — Alford Law Group, Inc.; Tobi C. Clinton; William E. Alford

(57) ABSTRACT

In one embodiment of the invention, a method of logic synthesis is disclosed. The method includes generating a plurality of design architecture alternatives for circuit logic of a data path cluster; saving the plurality of design architecture alternatives; and evaluating the plurality of design architecture alternatives in response to design constraints to select a preferred design architecture.

19 Claims, 12 Drawing Sheets

(56) References Cited

OTHER PUBLICATIONS

Cocke,J. "Global Common Subexpression Elimination" Proceedings of a Symposium on Compiler Construction, ACM SIGPLAN Notices 5(7), Jul. 1970, pp. 850-856.

Hosangadi,A.; Fallah,F.; Kastner,R. "Common Subexpression Elimination Involving Multiple Variables for Linear DSP Synthesis" Proceeding of 15th IEEE International Conf. On Application-Specific Systems, Architecture and Processors (ASAP '04 pp. 202-212.

Tseng,C.; Siewiorek,D. "Automated Synthesis of data paths in digital system" IEEE Transactions on Computer-Aided Design. Jul. 1986. pp. 379-395.

* cited by examiner

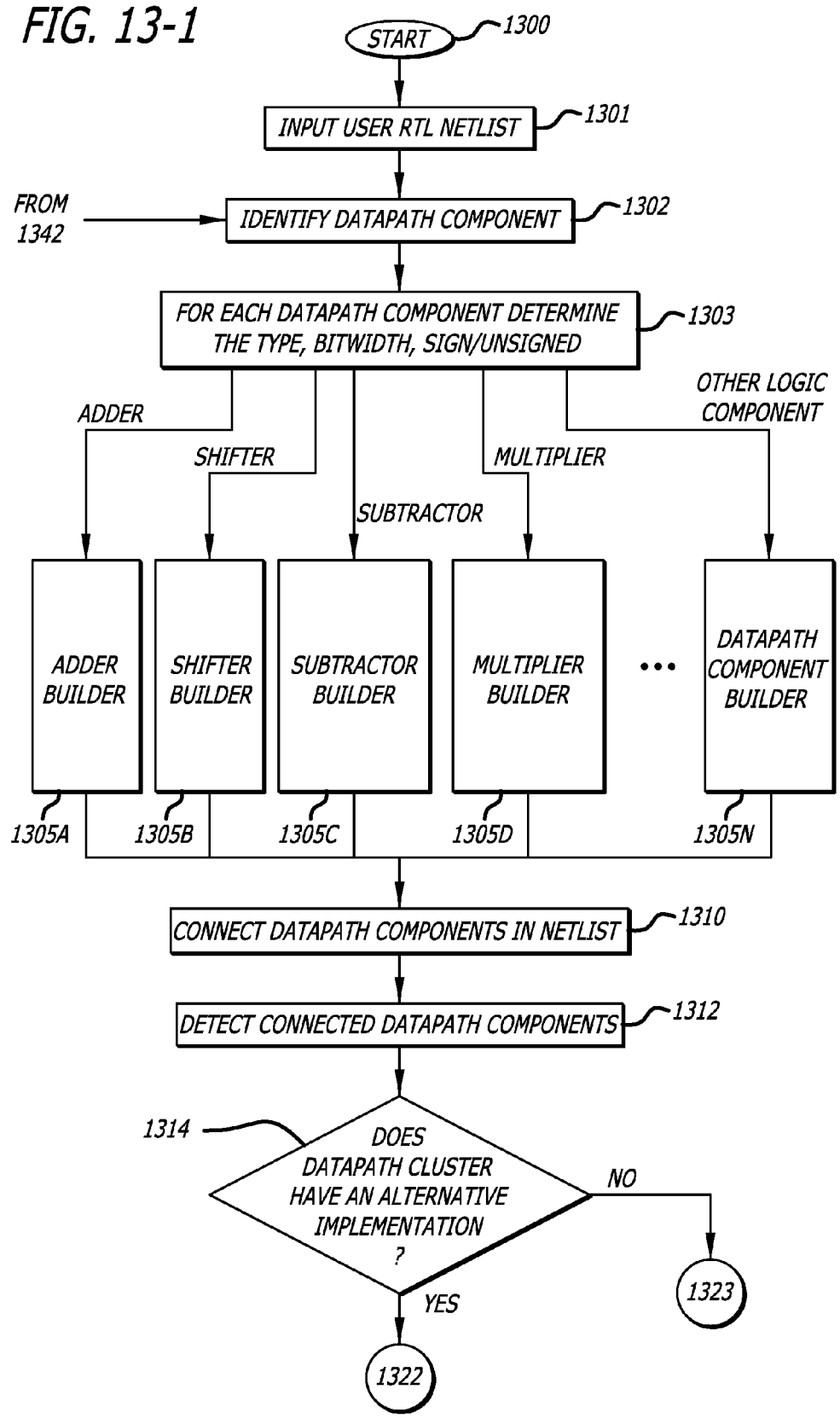

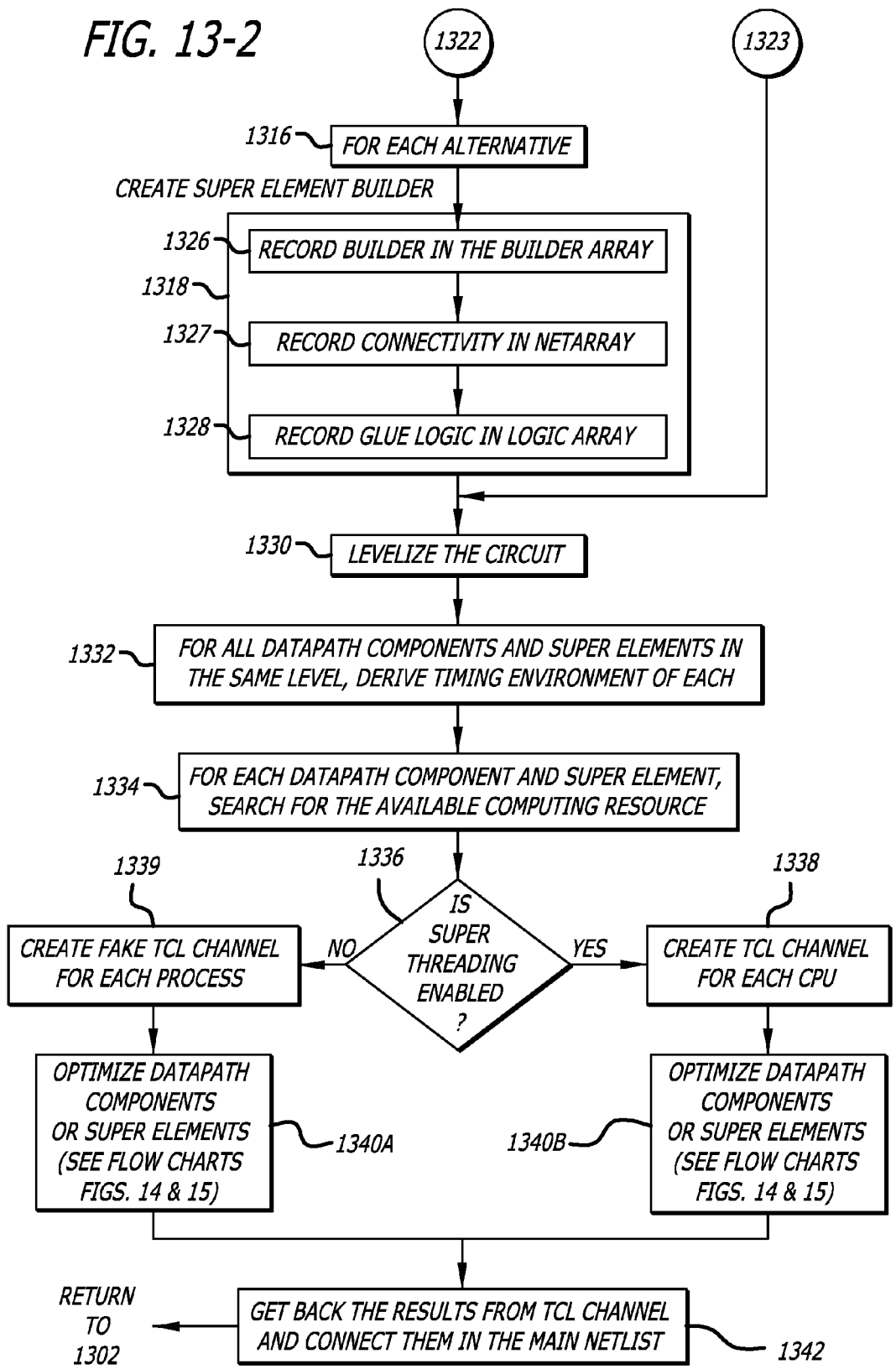

METHODS AND APPARATUS FOR DATA PATH CLUSTER OPTIMIZATION

FIELD

The embodiments of the invention relate generally to circuit synthesis of an integrated circuit.

BACKGROUND

Data path architectures are typically selected during register-transfer level (RTL) synthesis. After physical placement and routing, the selected data path architecture is usually not revisited.

The data path architecture selected by a logic synthesis tool may be suboptimal for a couple of reasons. The physical effects of a selected data path architecture are difficult to predict before placement and routing. The estimation of area usage, timing delays, and power consumption can be inaccurate without knowledge of the physical effects of the selected data path architecture. Typically after the initial physical implementation of the selected data path architecture, a logic synthesis tool does not review the data path architecture, nor does the typical logic synthesis tool rebuild and refine the data path components in the data path architecture.

BRIEF SUMMARY

The embodiments of the invention are summarized by the claims that follow below.

BRIEF DESCRIPTIONS OF THE DRAWINGS

FIGS. 13-1 and 13-2 is a flowchart of a more detailed data path synthesis process.

DETAILED DESCRIPTION

In the following detailed description, numerous specific details are set forth in order to provide a thorough understanding of the embodiments of the invention. However, the embodiments of the invention may be practiced without these specific details. In other instances well known methods, procedures, components, and circuits have not been described in detail so as not to unnecessarily obscure aspects of the embodiments of the invention.

Introduction

A framework is disclosed to optimize and refine a set of data path operators (also referred to as data path clusters) during the implementation process. Data path architecture and components are refined during a physically-aware logic synthesis of complex cell-based digital designs. An algorithm and methods to optimize data path cluster for both delay and area are further disclosed.

A data path cluster may be derived from arithmetic expressions in polynomial form described from hardware description languages (HDL) such as Verilog and VHDL. The area of data path clusters may be minimized while user specified timing constraints are satisfied.

Figure 1:
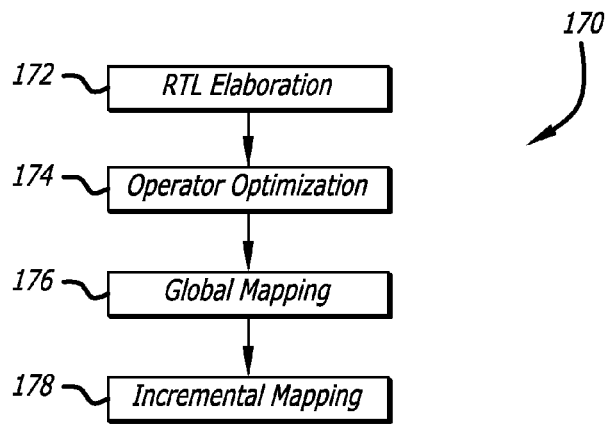
FIG. 1 is a flow chart of a methodology of logic synthesis in which data path optimization is included.

Referring now to FIG. 1, a logic synthesis methodology flow 170 is illustrated. The logic synthesis methodology flow 170 includes register transfer level (RTL) elaboration 172, operator optimization 174, global mapping 176, and incremental mapping 178.

A component builder, part of a data path optimization tool, may explore multiple architectures of a single data path operator according to its timing environment at each step of the methodology flow 170. The smallest architecture that satisfies a user's timing constraints is usually accepted.

Hierarchical-Builders

Figure 2B:
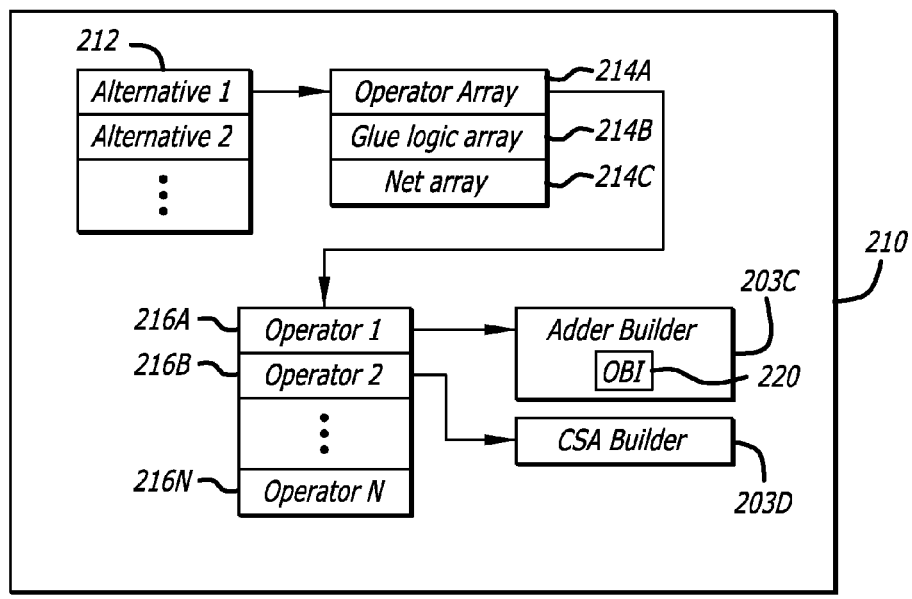
FIG. 2B is a block diagram of super builder information stored for various alternative design architectures.
Figure 2A:
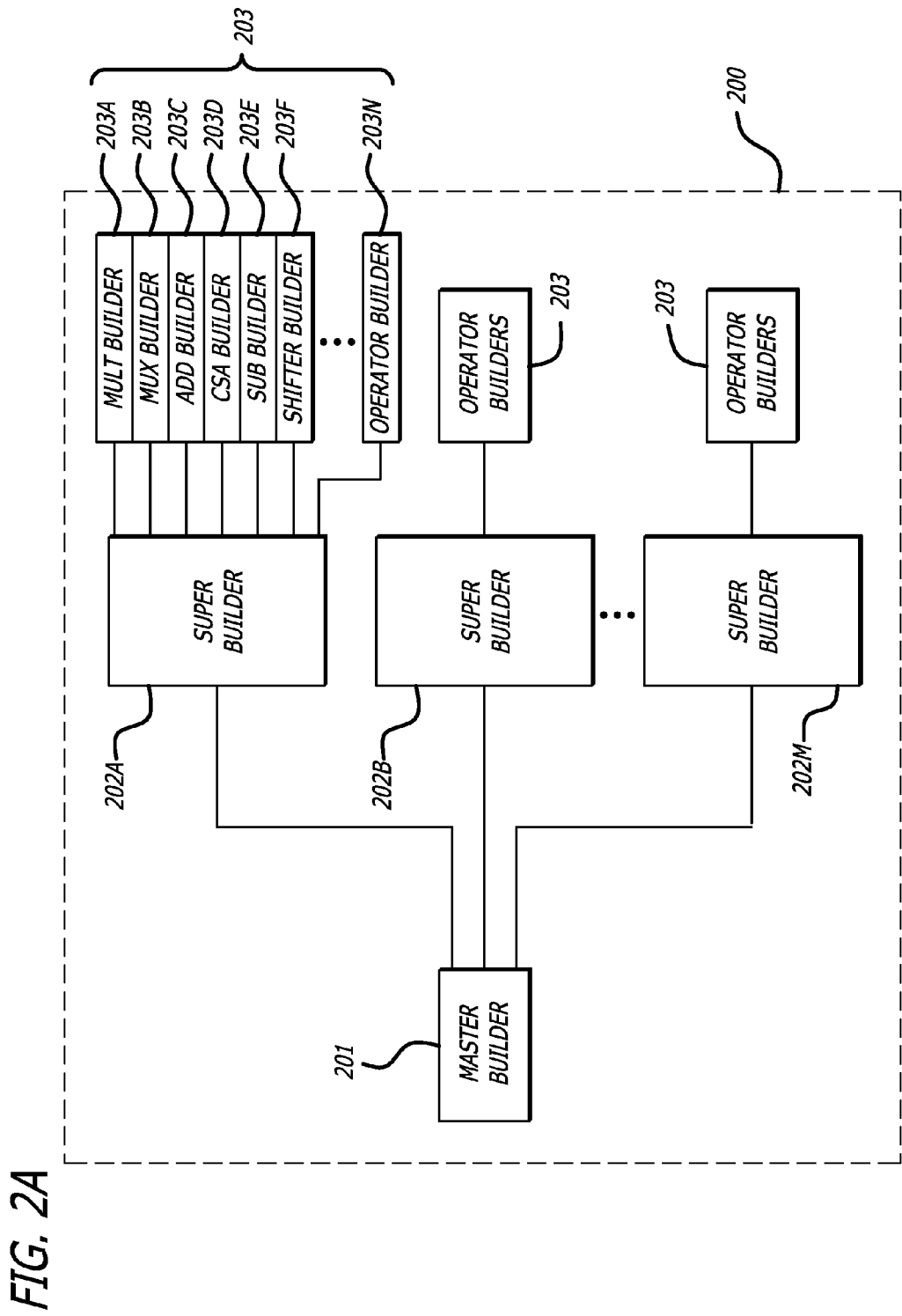
FIG. 2A is a functional block diagram of a hierarchical synthesis tool.

Referring now to FIG. 2A, a block diagram of a hierarchical synthesis tool 200 is illustrated. The hierarchy of the synthesis tool includes a hierarchy of builders including a master builder 201, one or more super builders 202A-202M under the control of the master builder, and one or more operator builders 203A-203N under the control of a super builder. The hierarchy of builders may synthesize different levels of logical hierarchy of an integrated circuit.

A super builder 202A-202M is a data path component builder that synthesizes or builds a data path cluster. The one or more operator builders 203A-203N include a multiplier (MULT) builder 203A, a multiplexer (MUX) builder 203B, an adder (ADD) builder 203C, a carry-save-adder (CSA) builder 203D, a subtractor (SUB) builder 203E, a shifter (SHIFT) builder 203F, and other types of operator builders 203N ordinarily associated with logic operators, such as dividers or counters, for example.

Super-Builders

The embodiments of the invention explore multiple architectures with a group of data path operators. While an operator builder is used for a single data path operator, a builder for a group of data path operators is called a super-builder 202A-202M. Within a super-builder, several architectures for a cluster of data path operators are stored. During logic synthesis processes, several architectures for a data path cluster are built, optimized and compared.

A super-builder has a number of characteristics to select an optimal architecture for a data path cluster.

A first characteristic of a super-builder is rebuildability of components. A component is said to be un-rebuildable if the original information has already been lost during steps of logic optimization. For example, this information can be lost if an adder and subtracter are optimized together using normal synthesis optimization. The boundary between the adder and subtracter is destroyed. Without keeping builder information with the combined circuitry, it is difficult to reconstruct an adder and subtracter based on their environment.

Not only are the operation type, input bit width, and output bit width stored, but the super builder also stores original builder information for every involved operator as well as their connectivity. With the original builder information being stored, a super builder is able to rebuild or re-synthesize a data path cluster according to its environment.

Referring now to FIG. 2B, a block diagram is illustrated of typical super builder information 210 that is stored for various alternative architectures 212. For each alternative architecture 212 of a data path cluster, alternative 1 for example, an operator builder array 214A, a glue logic array 214B, and a net array 214C are stored.

The operator builder array 214A is the list of logical operators used for the given architecture of the data patch cluster. The operator builder array 214A may include one or more logical operators 216A-216N. For example, the first logical operator 216A may be an adder that is to be built by an adder builder 203C. The second logical operator 216B may be a carry-save-adder that is to be built by a CSA builder 203D, for example.

Each builder may store original builder information (OBI) 220 such as logic type (add, mult, sub, mux, shift, etc.), input operands, output operands, its bit-width, and its logical form such as signed, unsigned, or two's compliment.

The glue logic array 214B is the logic, if any, between logical operators in the given architecture of the data patch cluster. The net array 214C is the nets or interconnect wires between the logic that couple the glue logic and the logical operators together in the given architecture of the data patch cluster.

Portability Over Super-Thread Channels

Figure 16:
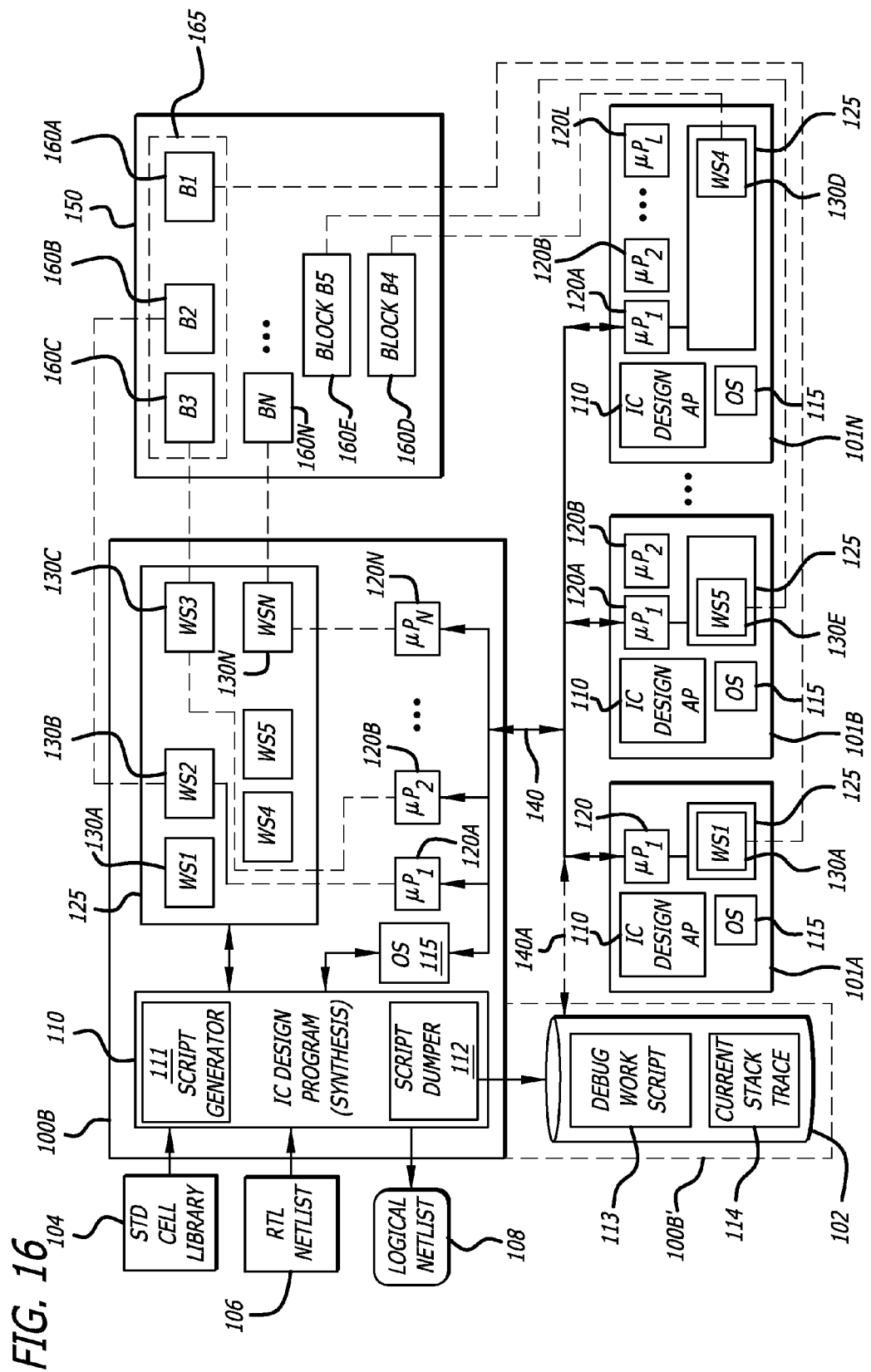
FIG. 16 is a block diagram illustrating an integrated circuit design program in a computer system that forms work scripts that are shared over a network with other computer systems to synthesize and optimize data path clusters of the integrated circuit design, in accordance with some embodiments of the invention.

As discussed herein, one of the characteristics of a super-builder is the rebuildability of the components that it synthesizes. To speed up architecture exploration, a synthesizer, acting as a master process, can send builder information as well as its environment over a super-thread channel to additional processors as slave processes to execute synthesis jobs in parallel to explore the various architectures of a data path cluster. FIG. 16, described further herein, illustrates an exemplary super-threading system in which copies of a super-builder may function. U.S. patent application Ser. No. 11/756,157, filed by Denis Baylor on May 31, 2007, describes super-threading in detail and is incorporated herein by reference. The saved information and rebuildability of the super builder, enables the portability of architecture synthesis over a super-thread channel in a super-threading system.

Levelized Rebuilding Procedure

The architecture of one data path component may depend on the outcome of another related data path component in a data path cluster. Thus, the data path components in a data path cluster are constructed in levelized manner from input signals to the output signals.

Figure 3A:
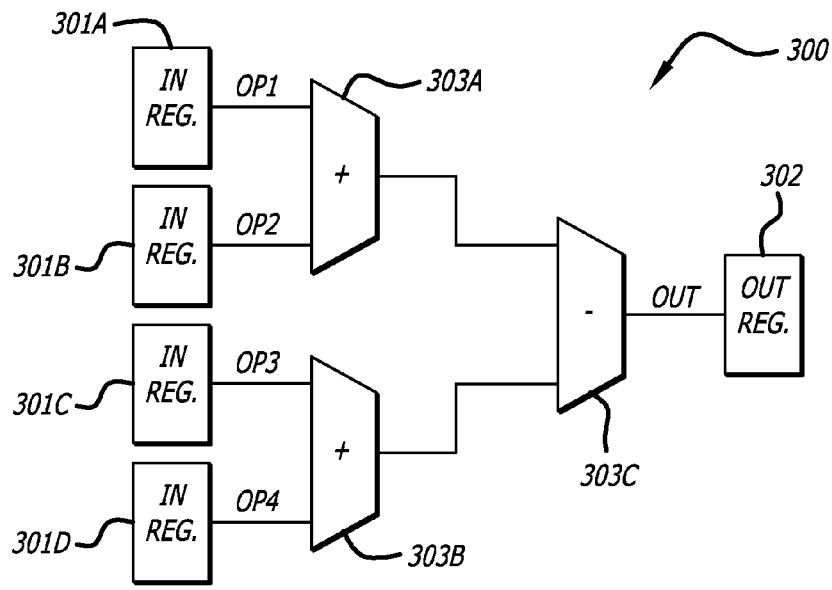
FIG. 3A is a functional block diagram of an exemplary data path cluster to illustrate a levelized building sequence of data path operators.

Referring now to FIG. 3A, an exemplary data path cluster 300 is illustrated. The data path cluster 300 includes adders 303A-303B and a subtracter 302 coupled together as shown between input registers 301A-301D (providing the input operand signals OP1-OP4 to the data path cluster) and an output register 302 registering the output signal OUT. A super-builder will build or synthesize a data path cluster in a levelized manner from the input signals coupled into the data path cluster to the output signals generated by the data path cluster.

In the cluster 300 shown in FIG. 3, the adder 303A is built first by the super-builder. The timing delay of the adder 303A is determined by a timing analyzer portion of the synthesizer and is one boundary condition for the build or synthesis of the subtracter 303C. Prior to building subtracter 303C coupled to the output OUT, adder 303B is built by the super-builder. The timing analyzer of the synthesizer determines the timing delay of signals through the adder 303B and is another boundary condition for the build or synthesis of subtracter 303C. In response to the boundary conditions (e.g., the timing delays of adders 303A-303B), the super-builder builds the subtracter 303C.

Hierarchical Support (Builder of Builders)

Figure 3B:
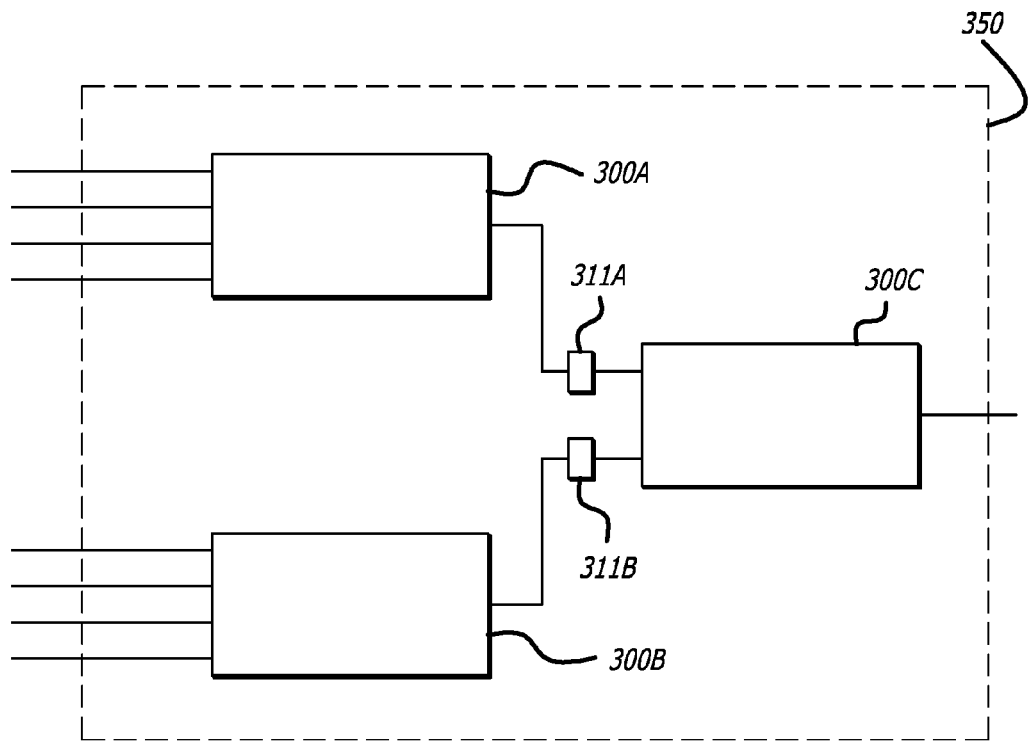
FIG. 3B is a functional block diagram of an exemplary cluster of a plurality of clusters.

Referring now to FIG. 3B, a super builder may provide hierarchical synthesis in that it can be extended to build or synthesis a cluster of a plurality of clusters. That is, one super builder may include components built by another super builder. A cluster of a plurality of clusters (data path operators) generated by a super builder may be referred to as a super element.

For example, a cluster (super element) 350 of a plurality of clusters 300A-300C coupled together is illustrated in FIG. 3B. A pair of registers 311A-311B may be the glue logic, for example, of the cluster (super element) 350. Each instance of the plurality of clusters 300A-300C may be an instance of the cluster 300 illustrated in FIG. 3A for example built by a first super builder. A second super builder may use the clusters 300A-300C to build or synthesize the cluster (super element) 350, for example. In this manner, the second super builder can hierarchically synthesize the netlist of a circuit.

Instead of serially performing the synthesis of a data path architecture, a super builder allows alternate architectures to be explored in parallel as it provides rebuildability and modularity of the synthesis process. Maintaining multiple architectures for a data path operator cluster, the timing and area driven architectures can be accurately optimized. After placement and routing when the wire delay may contribute significantly to the delay of a circuit, the super builder enables architecture refinement to improve upon the timing delay of a circuit.

Exploration of Multiple Data Path Architectures

There are often multiple design alternatives of a data path architecture that may be used to provide a substantially similar overall logical function. For example, an and-or-invert logical function may be synthesized in different ways with different types of logic gates. Each of these different design alternatives may be built in advance (pre-built) before synthesizing the entire chip. To efficiently explore a data path architecture, the pre-built alternatives 212 are stored into the super builder as part of the super-builder information 210.

The synthesis system may automatically choose one of the pre-built alternatives 212 in response to circuit constraints, such as timing or layout area. Alternatively, a user may select an alternative data path architecture based on information or experience.

Consider as another example in data path architecture exploration, the logical function of a carry-save-adder (CSA) in the data path. The carry-save-adder (CSA) architecture is one of the more versatile logical functions to synthesize for data path optimization. It is difficult to characterize the superiority of one synthesized logic design of a carry-save-adder (CSA) architecture transformed from another synthesized logic design of the carry-save-adder (CSA) architecture. Possible transformations of CSA architectures that may be automatically explored by a super builder for a carry-save-adder (CSA) architecture are now described.

CSA Tree Sharing

A carry save adder (CSA) tree usually has two bused outputs, carry output bus and a sum output bus. The values of the carry output bus and the sum bus are eventually summed together to form the final output from a carry save adder.

Figure 4:
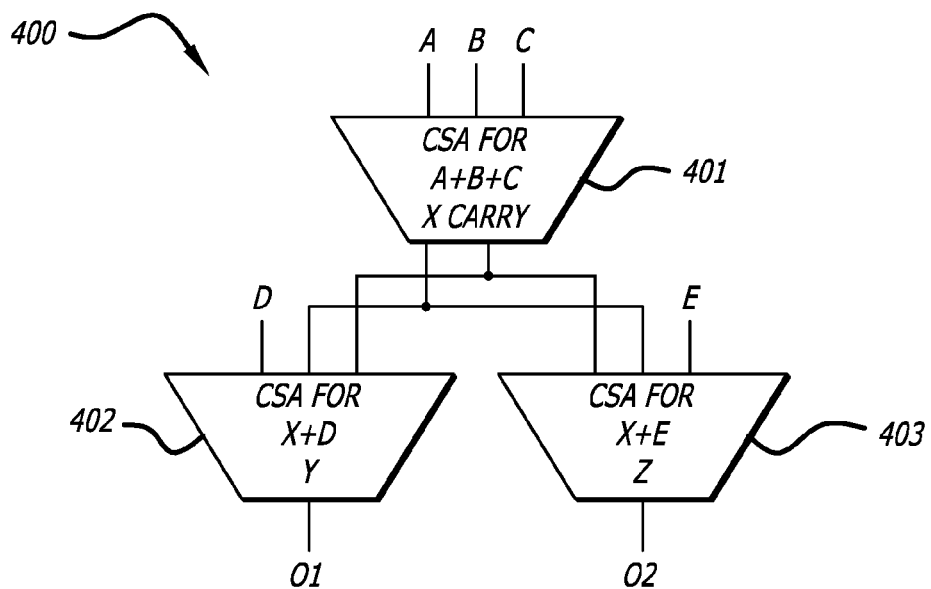
FIG. 4 is a functional block diagram of a data path cluster having a shared carry-save-adder structure.

Referring now to FIG. 4, a data path cluster 400 includes three carry save adders 401-403 coupled together as shown. The CSA 401 receives operands A, B, and C to generate a carry output and an X sum output. The X sum output bus and the carry output bus are both generated in response to the addition equation X=A+B+C. Note the carry output and the X sum output of the CSA 401 are coupled as inputs into both the CSA 402 and the CSA 403. The CSA 402 receives operands D, X, and Carry to generate a Y output. The Y output is generated in response to the addition equation Y=D+X+Carry. The CSA 403 receives operands E, X, and Carry to generate a Z output. The Z output is generated in response to the polynomial equation Z=E+X+Carry.

Tree sharing occurs when there are common expressions in a set of polynomial equations that are shared with other logic circuits. If the output of a CSA is shared, it may be referred to as CSA tree sharing. In the data path cluster 400 illustrated in FIG. 4, tree sharing occurs as a result of the carry output bus and the X sum output bus of the CSA 401 being coupled into both the CSA 402 and CSA 403. That is, the carry output bus and the X sum output bus of the CSA 401 are common expressions with carry save form in the polynomial equations for Y and Z.

Tree sharing, through the sharing of logic among a set of polynomial equations, usually reduces the circuit area of a data path cluster in comparison to an alternate data path cluster design without tree sharing.

However, tree sharing may form a data path cluster with slower logic circuitry and skew the arrival times of the equations' inputs by requiring earlier arrival times. If tree sharing is not used in the data path cluster 400, slower input signals can be implemented closer to the final output or outputs O1 and O2 of the data path cluster. That is, the arrival times of input signals to the data path cluster may be more relaxed.

Consider input signal C for example and assume that the arrival time or delay time of input signal C is greater than the maximum of the delay times of inputs A, B, D, and E. That is, delay(C)>max [delay(A), delay(B), delay(C), delay(D), delay(E)]. In this case, input signal C is shared with other logic in the data path cluster by the polynomial X=A+B+C. The delay through the data path cluster from input C to the output O1 is the delay through the CSA 401 and CSA 402 summed together or CSA(C→T)+CSA(T→O1). If input signal C arrives very late, the summed delay through the data path cluster may be not meet timing constraints of an integrated circuit.

In contrast, if the polynomial X=A+B+C were not shared with other logic in the data path cluster, the data path cluster may be synthesized with a different carry save adder design so that the timing delay CSA(C→O1) through the carry save adder is as fast as possible.

Figure 5:
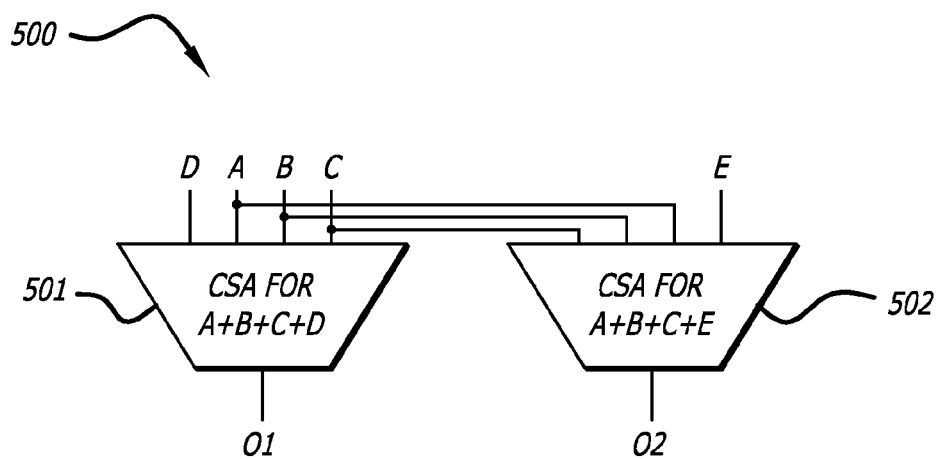
FIG. 5 is a functional block diagram of a data path cluster without a shared carry-save adder structure but having the same overall functionality of the data path cluster of FIG. 4.

Referring now to FIG. 5, a data path cluster 500 with an overall equivalent logic function to that of data path cluster 400 is illustrated. The data path cluster 500 includes a pair of four input carry save adders 501-502 to generate the same logical outputs O1 and O2. The CSA 501 implements the equation O1=A+B+C+D similar to the logical output O1 of the CSA 402. The CSA 502 implements the equation O2=A+B+C+E similar to the logical output O2 of the CSA 403. As the data path cluster 500 is synthesized with a single level of CSA, the timing delay through the data path cluster is that of a single CSA(C→O1) that may be synthesized as fast as possible.

Because it is difficult to predict the exact arrival times of the input signals into a data path cluster, a super builder saves both data path cluster design alternatives, the data path cluster 400 with CSA tree sharing and data path cluster 500 without tree sharing.

CSA Tree Vs. Non CSA

The data path cluster 400 illustrated in FIG. 4 has a CSA tree where the first CSA 401 for adding (A+B+C) has two outputs that feed to the CSA tree of the second CSA 402 for adding (X+D) and the third CSA 403 for adding (X+E). However, the full CSA adders 402 and 403 need not be used to perform the same logical function. A reduced logic circuit that employs half adders instead of full adders may be used instead.

Figure 6:
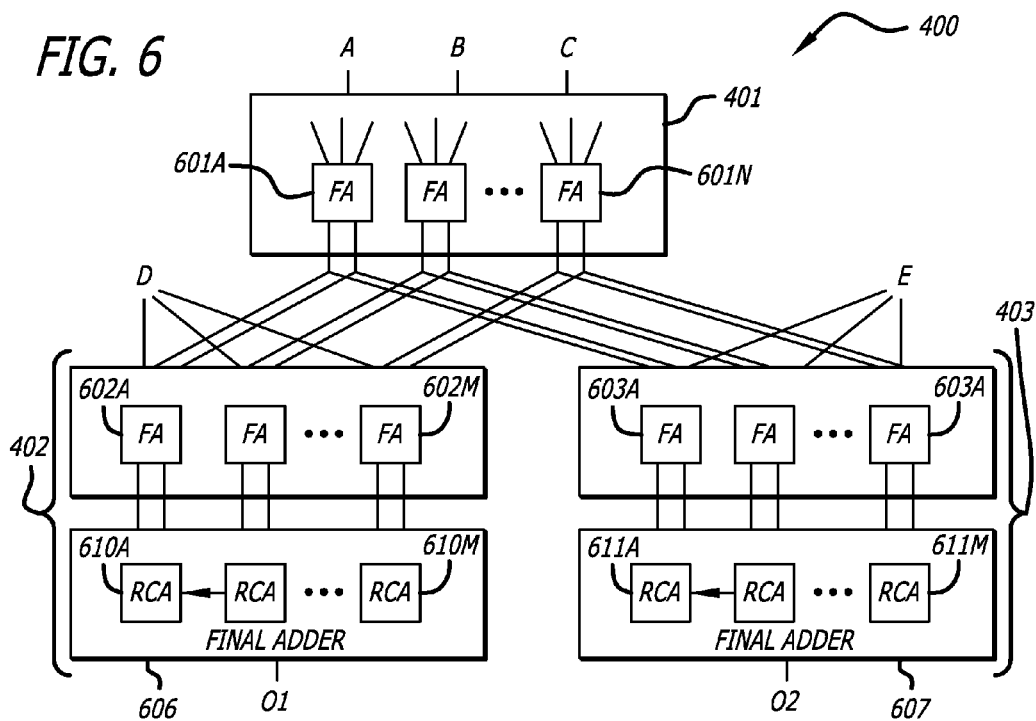
FIG. 6 is a more detailed functional block diagram of the data path cluster of FIG. 4 having the shared carry-save-adder structure.

Referring now to FIG. 6, a level of detail of the carry save adders 401-403 forming the data path cluster 400 is illustrated. The data path cluster 400 includes the CSA 401 coupled to the CSA circuits 402-403 as illustrated.

The CSA 401 includes a row of full adders 601A-601N responsive to the maximum bit width of the input signals A, B, and C.

The CSA 402 and the CSA 403 respectively include a row of full adders 602A-602M and 603A-603M responsive to the number of output bits (two N bit output buses–one N bit output bus for carry and one N bit output bus for sum) from the full adders 601A-601N. The CSA 402 and the CSA 403 further respectively include final adders 606-607 formed by a row of ripple carry adders 610A-610N and 611A-611N to add the bits output from the full adders together to obtain the final resultant sum outputs O1 and O2, respectively.

If signal timing is not critical through a data path cluster, such as data path cluster 400, the logic circuits in the data path cluster 400 may be reduced such as by employing half adders instead of full adders in a row of the logic. This can reduce the silicon area used to synthesize the circuitry of a data path cluster.

Figure 7:
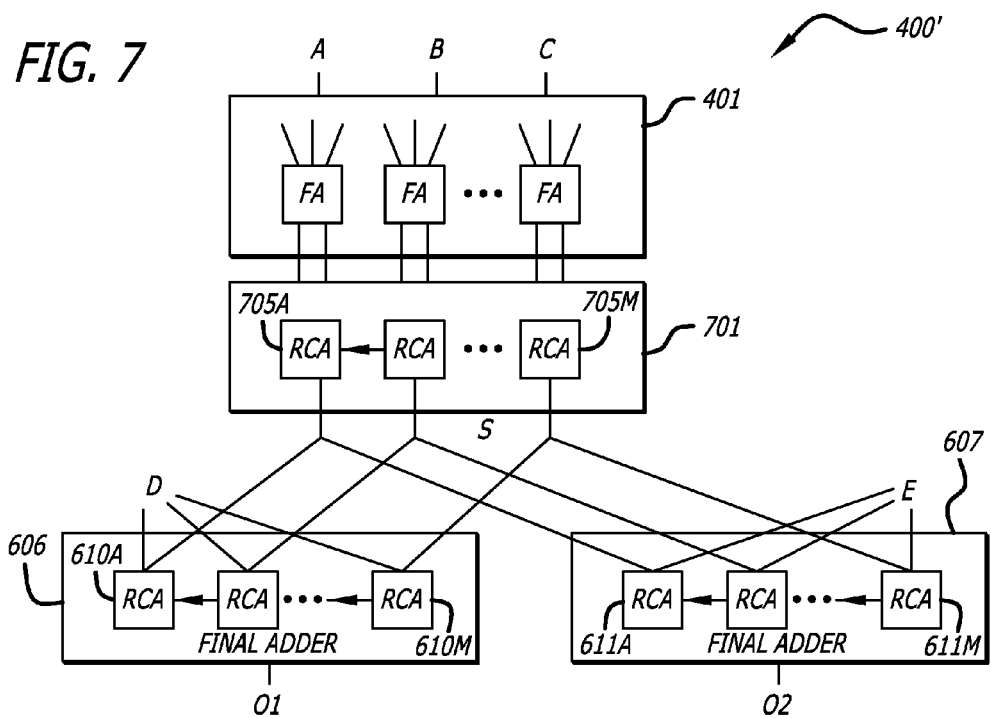
FIG. 7 is a functional block diagram of a data path cluster architecture with reduced logic circuitry in comparison with that of the data path cluster architecture of FIG. 6.

Referring now to FIG. 7, a data path cluster 400' is illustrated having the same overall logical function of the data path cluster 400 to generate the same logical outputs O1 and O2 in response to the input signals A, B, C, D, and E. However, the data path cluster 400' uses less logic circuitry to accomplish the same function.

Instead of two rows of full adders 602A-602M and 603A-603M, the data path cluster 400' employs a single row 701 of ripple carry adder cells 705A-705M to sum up each of the sum bit and carry bit outputs from the full adders 601A-601N. That is, the single row 701 of ripple carry adder cells 705A-705M generate a sum S of equation (A+B+C). The sum S is coupled as an operand into each of the final adders 606-607 formed by a row of ripple carry adders 610A-610N and 611A-

611N respectively. The input signal D is coupled into the final adder 606 as its second operand. The input signal E is coupled into the final adder 607 as its second operand. The final adder 606 performs the addition of the sum S and the input signal D, the operation O1=(S+D). The final adder 607 performs the addition of the sum S and the input signal E, the operation O2=(S+E).

The data path cluster 400' reduces the logic circuitry by avoiding the use of at least one row of full adders in comparison with the data path cluster 400 illustrated in FIG. 6. However as a result of the timing delays through the data path cluster 400', it may not the design architecture of choice when signal timing is critical.

Because the signal timing of a data path cluster cannot be precisely predicted, a super builder saves both data path cluster design alternatives, the data path cluster 400 with CSA tree sharing and the data path cluster 400' without a CSA (non-CSA) and one less row of full adders.

CSA Over Mux

Figure 8:
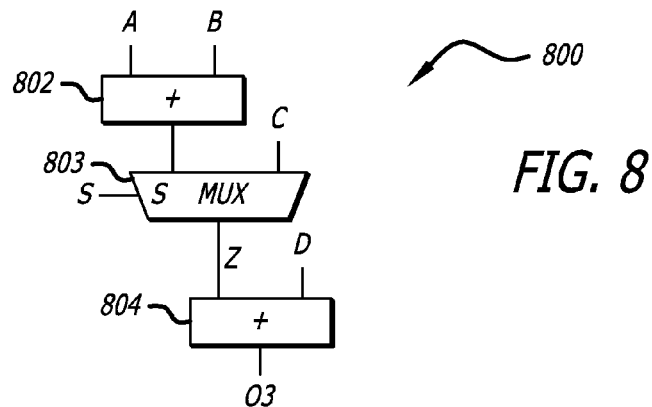
FIG. 8 is a functional block diagram of a data path cluster with a polynomial expression separated by a multiplexer.

Referring now to FIG. 8, a data path cluster 800 is illustrated including a first adder 802, a multiplexer 803, and a second adder 804 coupled together as shown. The data path cluster 800 has a polynomial expression separated by a multiplexer 803.

If an expression is separated by a multiplexer, the expression may be rearranged so that operators on one side of the multiplexer can be combined with the operators on the other side of the multiplexer.

In FIG. 8, the output of the adder 802 generating A+B is coupled as a selectable input to the multiplexer 803. The output Z of the multiplexer 803 is coupled into the adder 804 generating the output O3 as the operation O3=Z+D. The expression for O3 is separated by the multiplexer 803. The output O3 is logically D+(A+B) or D+(C) depending upon the selected output of the multiplexer 803. The expression D+(C) may be expanded by adding zero to C such as in the expression D+(C+0).

Thus, the data path cluster 800 may be transformed into an alternate design architecture to speed up the delay paths by moving the multiplexer 803 to select input signals and not an intermediate polynomial expression.

Figure 9:
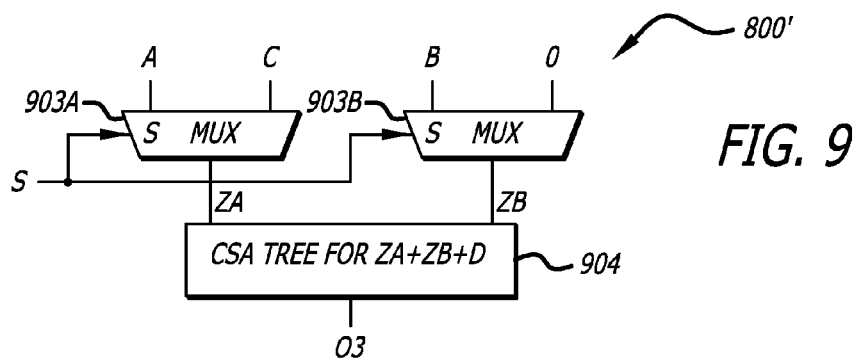
FIG. 9 is a functional block diagram of an alternative data path cluster design providing the same overall logical functionality of the data path cluster illustrated in FIG. 8.

Referring now to FIG. 9, an alternative data path cluster design 800' is illustrated providing the same overall logical functionality of the data path cluster 800 illustrated in FIG. 8.

The data path cluster design 800' includes a pair of multiplexers (Muxes) 903A and 903B and a carry-save-adder (CSA) 904 coupled together as shown. Each pair of multiplexers 903A and 903B have their select control input controlled by an input signal S. Mux 903A receives the input signals A and C and selects one of them to output as ZA in response to the select signal S. Mux 903B receives the input signal B and a logical zero 0 and selects one of them to output as ZB in response to the select signal S. In one case, the select signal S selects ZA and ZB to respectively be A and B. In another case, the select signal S selects ZA and ZB to respectively be C and O.

In comparing the alternate designs of the data path clusters 800 and 800', the multiplexer 803 in FIG. 8 is in effect moved towards the input signals as a pair of multiplexers 903A-903B to multiplex the three input signals A, B, and C into the carry save adder 904.

The expression ZA+ZB+C can then be summed together by a single CSA tree with the signal CSA 904 to improve the total delay through the data path cluster 800 in evaluating the output O3 and performing A+B and Z+D.

However if the select line S of the multiplexer is more timing critical than the input signals A and B, then the timing criticality may be increased by using the muxes 903A and 903B and multiplexing the input signals A and B. The increase in delay may be from Z+D in the data path cluster 800 to ZA+ZB+D in the data path cluster 800'. That is, if the input signal timing delay is greater than that of the input signals A and B, the overall timing delay in the data path cluster 800' may be greater than that of the data path cluster 800.

Note that the timing criticality of the input signal S used to control the multiplexer selections is difficult to predict prior to synthesis making the overall signal timing of a data path cluster difficult to predict precisely. Thus, a super builder saves both data path cluster design alternatives, the data path cluster 800 with an intermediate multiplexer and the data path cluster 800' with input signal multiplexers and CSA. During synthesis, the design alternatives may be evaluated by the super builder in order to select the better architecture to meet design constraints.

Speculation

Figure 10:
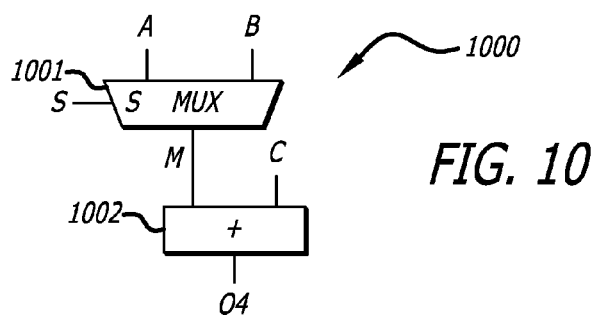
FIG. 10 is a functional block diagram of a data path cluster 1000 that may be transformed by speculation into an alternate data path cluster design.

Referring now to FIG. 10, a data path cluster 1000 is illustrated including a multiplexer 1001 and an adder 1002 coupled together as shown. The design of the data path cluster 1000 may be transformed by speculation into an alternate data path cluster design.

Speculation can be viewed as data path operator cloning. When a multiplexer (mux) is connected to an operator and the select line of the mux is timing critical, speculation can speed up the circuit by rearranging the mux circuit.

In the data path cluster 1000 illustrated in FIG. 10, the mux 1001 output M is coupled into the adder 1002 as one operand. The input signal C is coupled into the adder 1002 as a second operand. Input signal S is coupled into the select control input of the mux 1001 and is timing critical in generating the multiplexer output M. The input signals A and B may arrive and be valid prior to the arrival of a valid select signal S. Speculation may be used to transform the data path cluster 1000 into a faster circuit.

Figure 11:
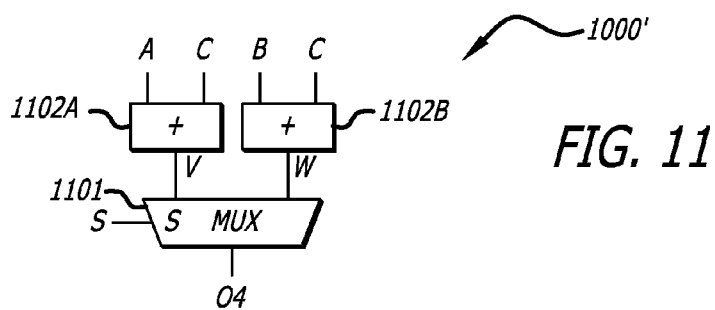
FIG. 11 is a functional block diagram of an alternative data path cluster design providing the same overall logical functionality of the data path cluster illustrated in FIG. 10.

Referring now to FIG. 11, a data path cluster 1000' having the same overall logic functionality of the data path cluster 1000 is illustrated. The data path cluster 1000' includes a pair of adders 1102A-1102B coupled to a multiplexer 1101 as illustrated. The input signal C is coupled as an operand into both of the pair of adders 1102A-1002B. In this manner, the respective outputs V and W of the adders 1102A-1002B may be evaluated and valid prior to the select signal S being valid. With the data path cluster 1000', the propagation delay from S to output O4 is reduced by the timing delay of adder 1002.

However, the data path cluster 1000' uses more circuit area than the data path cluster 1000 because the adder 1002 is duplicated into a pair of adders 1102A-1102B at the signal inputs to the cluster prior to the inputs to the multiplexer 1101. That is, the penalty for transforming a circuit with speculation is the area consumed on a circuit due to the extra adder.

The timing criticality of the input select signal S may change during various synthesis processes. Thus, a super builder saves both data path cluster design alternatives, the unspeculated data path cluster 1000 and the speculated data path cluster 1000. During synthesis, the design alternatives may be evaluated by the super builder in order to select the better architecture to meet design constraints and evaluate the trade off between area and speed.

Resource Sharing

Resource sharing for data path clusters is the reverse of speculation. In resource sharing, the goal is to share common operators. The mutually exclusive operations are separated by using multiplexers. Contrary to speculation, resource sharing may introduce additional delay on the inputs of a multiplexer.

Resource sharing, for example, may transform the data path cluster 1000' illustrated in FIG. 11 into the data path cluster 1000 illustrated in FIG. 10.

Methods of Data Path Synthesis

Figure 12:
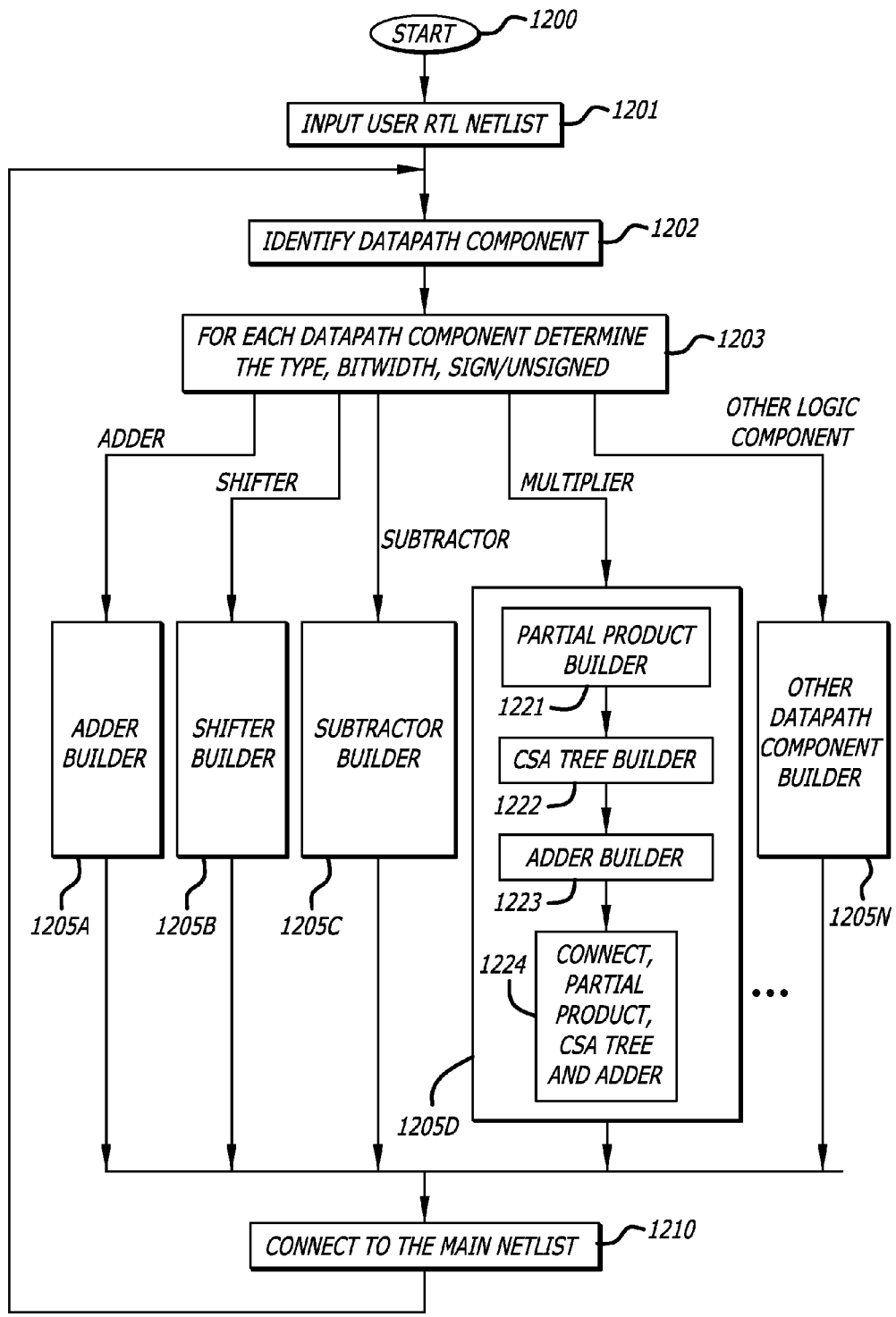
FIG. 12 is a flowchart of a simplified data path synthesis process.

Referring now to FIG. 12, a simplified data path synthesis flow chart is illustrated. The process starts and process block 1200 and then goes to process block 1201.

At process block 1201, an RTL netlist is received of all or a portion of an integrated circuit design. Design constraints of the RTL netlist may also be received. The process then goes to process block 1202.

At process block 1202, one or more data path components are identified that need to be synthesized as part of one or more data path clusters. The process then goes to block 1203.

At process block 1203, for each identified data path component, a determination is made as to its logic type (add, mult, sub, mux, shift, etc.), input operands, output operands, its bit-width, and whether its logical form is signed/unsigned/two's compliment. This information may be part of the original builder information. The process then goes to block 1204.

At process block 1204, one or a plurality of super-builder 1205A-1205N are used to synthesize each data path component in response to its logic type. An adder super-builder 1205A is used to synthesize an adder. A shifter super-builder 1205B is used to synthesize a shifter. A subtracter super-builder 1205C is used to synthesize a subtractor. A multiplier super-builder 1205D is used to synthesize a multiplier. Other data path component super-builders 1205N are used to synthesize other types of logic components.

Each of these super-builders may have lower level builders to form a data path component. For example, the multiplier super-builder 1205D includes a partial product builder 1221 to synthesize the logic to form partial products, a carry-save-adder (CSA) tree builder 1222 to synthesize the logic to add the partial products together, and an adder builder 1223 to synthesize the logic of the final adder. Further a super-builder may include an interconnect builder 1224 to connect lower level builders together such as the partial product logic, the CSA tree logic, and the final adders.

After the one or more of the super-builders 1205A-1205N are used to synthesize the data path components, the process goes to block 1210.

At process block 1210, the synthesized data path cluster and its components are next connected to the main netlist. After a data path cluster is connected, the process may return to process block 1202 to identify additional data path clusters, if any, continuing in a loop.

Referring now to FIGS. 13-1 and 13-2, a more detailed data path synthesis flow chart including optimization techniques is illustrated. The process starts and process block 1300 and then goes to process block 1301.

At process block 1301, an RTL netlist is received of all or a portion of an integrated circuit design. Design constraints of the RTL netlist may also be received. The process then goes to process block 1302.

At process block 1302, one or more data path components are identified that need to be synthesized as part of one or more data path clusters. The process then goes to block 1303.

At process block 1303, for each identified data path component, a determination is made as to its logic type (add, mult, sub, mux, shift, etc.), its bit-width, and whether its logical form is signed/unsigned/two's compliment. The process then goes to block 1304.

At process block 1304, one or a plurality of super-builder 1305A-1205N are used to synthesize each data path component in response to its logic type. An adder super-builder 1305A is used to synthesize an adder. A shifter super-builder 1305B is used to synthesize a shifter. A subtractor super-builder 1305C is used to synthesize a subtractor. A multiplier super-builder 1305D is used to synthesize a multiplier. Other data path component super-builders 1305N are used to synthesize other types of logic components.

As discussed previously with reference to FIG. 12, each of these super-builders may have lower level builders to form a data path component. After the one or more of the super-builders 1305A-1305N are used to synthesize the data path components, the process goes to block 1310.

At process block 1310, the synthesized data path cluster and its data path components are next connected to the main netlist. The process then goes to block 1312.

At process block 1312, other data path components connected to the netlist to form a data path cluster are detected in the netlist. This is to detect data path clusters that may have alternate architectural design implementations. The process then goes to block 1314.

At process block 1314, a determination is made if there is an alternate design implementation for the data path cluster. If so, the process goes to process block 1316. If not, the process skips process blocks 1316, 1318, and 1326-1328 to go to process block 1330.

At process block 1316, in response to an alternate architectural design implementation existing for the data path cluster, for each alternative a super builder or super element builder 202A-202M is created. The process then goes to block 1318.

At process block 1318, a process for each super builder or super element builder is undertaken including process blocks 1326-1328.

At process block 1326, the super element builder is recorded into a builder array of the super builder. The process then goes to block 1327.

At process block 1327, the connectivity of the data path components in the super element are recorded into a net array of the super builder. The process then goes to block 1328.

At process block 1328, if any glue logic is used to interconnect the data path components in a data path cluster, the glue logic is recorded into the logic array of the super builder. The process then proceeds to block 1330.

At process block 1330, the circuits forming the data path cluster are levelized between registers for the input and output signals. The process then goes to block 1332.

At process block 1332 in response to the levelization, for all the data path components and super elements in the same level, the timing environment for each is determined. The timing delays/arrival times for data path components and super elements in the same level may be determined using a timing analysis tool. The process then goes to block 1334.

At process block 1334, available computing resources are sought to optimize the data path cluster including each of the data path components and the super elements in the same level. The process block then goes to block 1336.

At process block 1336, a determination is made whether or not super-threading (described further herein with reference to FIG. 16) is enabled and available or disabled. If enabled and available, super-threading is used to concurrently explore design alternatives for a data path cluster and the process goes to block 1338. If super-threading is disabled and unavailable, the process goes to block 1339.

At process block 1339, with super-threading disabled, a fake TCL channel is created for each process. The process then goes to block 1340A.

At process block 1340A, one or more data path clusters or super elements and the data path components therein are optimized (FIGS. 14-15) using one or more processes of a given computer system without the availability of super-threading over a network of computer systems. The process then goes to block 1342.

At process block 1338, with super-threading enabled, a TCL channel is created for each available processor that can perform processes over the network in a super-threading system. The process then goes to block 1340B.

At process block 1340B, one or more data path clusters or super elements and the data path components therein are optimized (FIGS. 14-15) over a plurality of processors in one or more computer systems in a network with super-threading enabled. The process then goes to block 1342.

At process block 1342, the optimization results from the process or the TCL channel are returned and the synthesis results for the optimized data path clusters or super elements and the data path components therein are coupled to the main netlist.

The process may then return to process block 1302 to identify a next data path cluster and its data path components.

Figure 14:
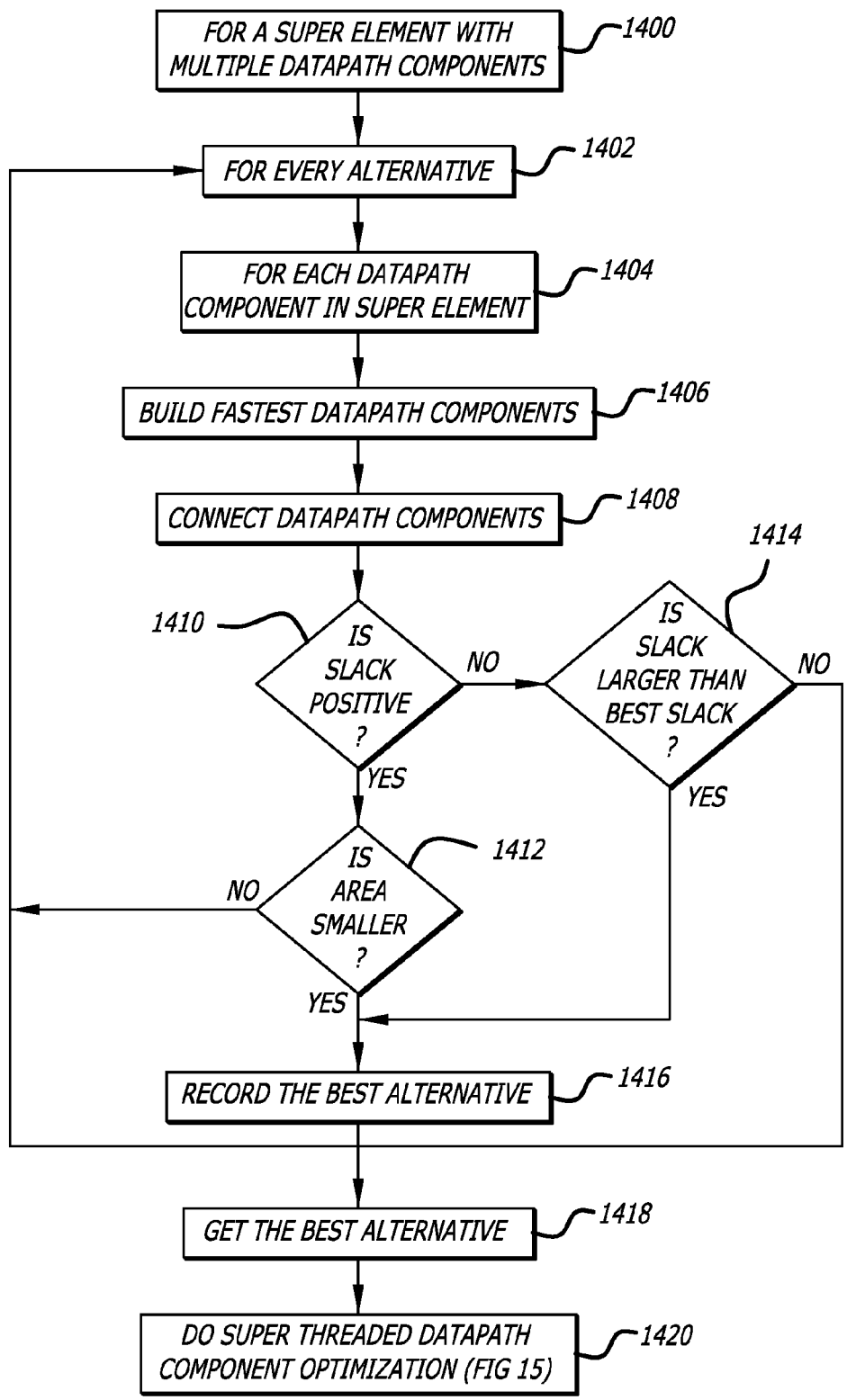
FIG. 14 is a flow chart of a process for optimizing one or more data path clusters or a super element.

Referring now to FIG. 14, the process for optimizing one or more data path clusters or a supper element is illustrated. As mentioned previously, a super element is a cluster of a plurality of data path components created by a super builder. The optimization of the data path clusters or super element may result in multiple alternatives. The optimization process may begin by synthesizing the fastest solution with the least time delay by using the best components. An exhaustive exploration is made by transforming the initial design into other design alternatives. For example, the architecture of the data path cluster 800 illustrated in FIG. 8 may be transformed into the alternate architecture of the data path cluster 800' illustrated in FIG. 9. The optimization process for a super-element begins at process block 1400 and then goes to process block 1042.

At process block 1402, a process loop is established for each alternative architecture available for a given super element or data path cluster. The process for each alternative design of the super-element or data path cluster then goes to block 1404.

At process block 1404, the data path components in the super element or data path clusters are itemized so that each can be processed together in the following process blocks. The process then goes to block 1406.

At process block 1406, each of data path components are built or synthesized to form an initial or alternative architecture for the one or more data path clusters or a super element. Initially, the fastest data path components may be selected for synthesis. The process then goes to block 1408.

At process block 1408, the data path components are connected together to form an alternate design of the super element or data path cluster. For example, the alternative data path cluster 1000' illustrated in FIG. 11 may be formed in comparison with the first architecture of the data path cluster 1000 illustrated in FIG. 10. The process then goes to block 1410.

At process block 1410, a determination is made as to whether or not the slack of the alternate design for the super element or data path cluster with the alternate data path components is positive or not. If the slack is positive, timing constraints have been met but a smaller layout area may be available. Thus if the slack is positive, the process goes to block 1412 to determine if the alternate design provided a smaller circuit area. If the slack is negative in the alternate design, the timing constraints were not met and the process goes to block 1414 to compare the slack in the alternative design with the design architecture having the best slack.

At process block 1414, with the slack being negative, a determination is made if the alternate design has more timing slack than the best slack of the other design alternatives. With the slack being negative for the given alternate design, any design with positive slack has more timing slack. However if all designs have negative slack, the given alternate design may have more slack and be a better alternate design if the absolute value of its negative slack number is less (closer to zero). Thus, if the slack of the alternate design is better than the current best slack of other designs, the process goes to block 1416. If the slack of the alternate design is not better than other saved designs, the design alternative may be saved but the processing then continues to the next design alternative, skipping block 1416.

At process block 1412, a determination is made whether or not the alternate design has a smaller area when the slack is positive. If the area is smaller, the process goes to block 1416. If the area is not smaller, the alternate design architecture may be saved for future reference but the process then goes back to block 1402 to process the next alternative design.

At process block 1416, with the area of the alternate design being less than the prior design or the slack being larger than the prior best slack, the alternate design is saved and recorded as a better alternate design. If all the alternate designs for the super element or data path clusters have been explored, the process goes to block 1418. If not all alternate designs have been explored, the process loops back to block 1402 to process the next alternative design.

At process block 1418, with all the design alternatives for the super-element having been explored, the best design alternative is selected for further processing with the data path. If all of the design architectures have negative slack, the design architecture with the most slack (least negative slack number) may be selected as the best alternative. Otherwise if there are some design architectures with positive slack numbers and some design architectures with negative slack numbers, the best alternative may be the design architecture with the smallest design using the least amount of area that has a positive slack number that meets timing requirements. After selection, the process goes to block 1420.

At process block 1420, the data path components are to be optimized. If super-threading is enabled and available, the super-threading process of data path component optimization illustrated in FIG. 15 occurs concurrently for multiple data path components. If super-threading is unavailable, the process of data path component optimization illustrated in FIG. 15 is still utilized but with less or no parallelism.

Figure 15:
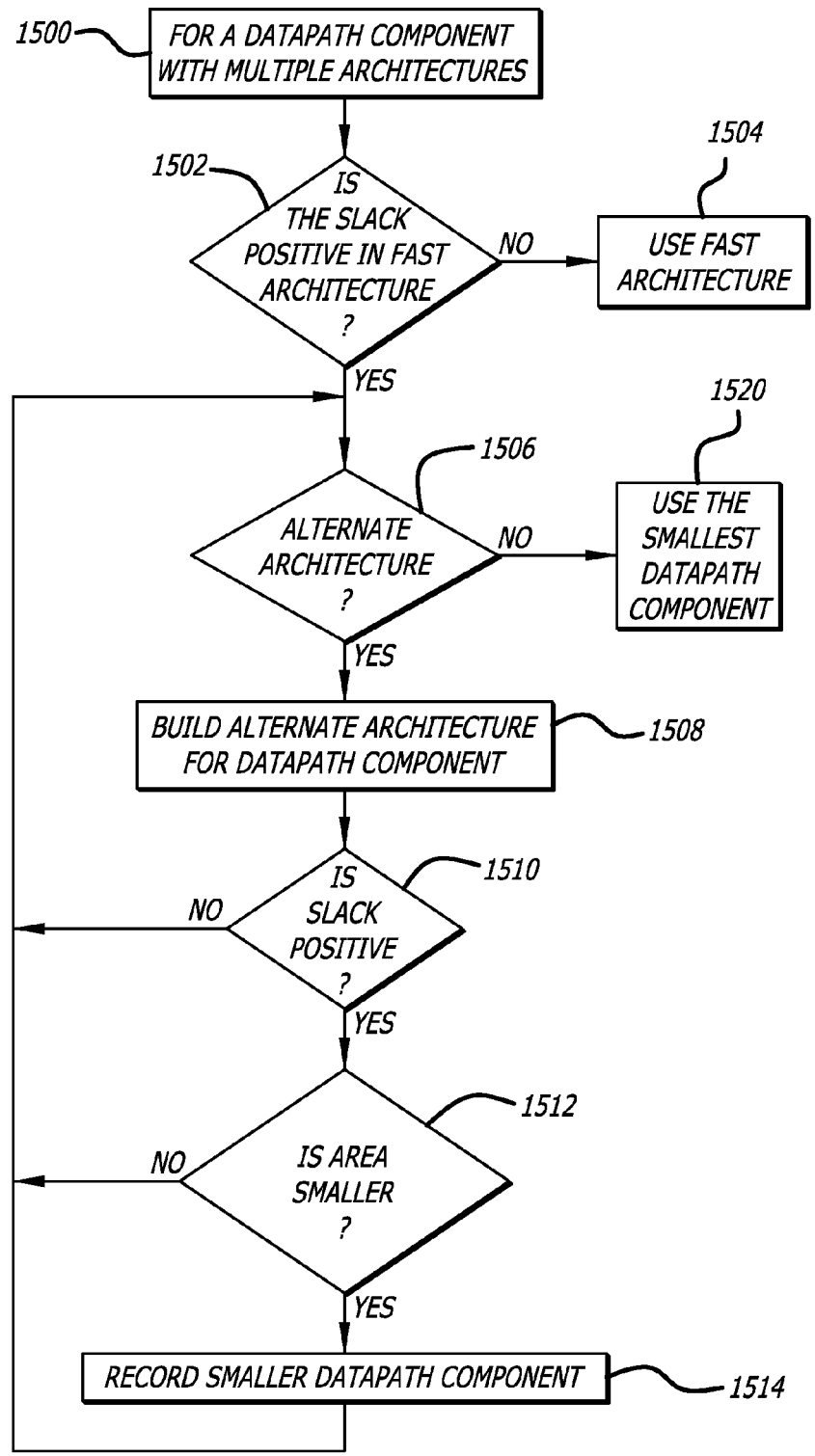
FIG. 15 is a flow chart of a process for optimizing a data path component.

Referring now to FIG. 15, the process for optimizing a data path component with one or more design architecture alternatives is illustrated. Alternative designs are explored for the data path components by transforming an initial fast design for a data path component into other design alternatives. The optimization process for data path components begins at process block 1500 and then goes to process block 1502.

At process block 1502, a determination is made if the fast design architecture for the data path component initially created has a positive slack. Positive slack indicates that timing constraint or goal has been more than met and that the design for the data path component may be more relaxed with a slower but smaller design architecture. Slower architectures typically are smaller using less layout area. If timing slack is not positive (zero or negative), the process goes to block 1504 and the fastest design architecture of the data path components is employed. If there is positive slack in the fast design architecture, the process goes to block 1506 to explore alternative architectures.

At process block 1506, a determination is made if there is an alternate design architecture for the data path component. This process is to explore alternative architectures to find the smallest design that meets timing. If no alternate design architecture exists for the respective data path component, then the process goes to process block 1520. If an alternate design architecture does exist for the respective data path component, then the process goes to block 1508.

At process block 1520, with none or no further alternate design architecture existing for the respective data path component, the smallest saved data path component is used as the respective optimized data path component. For example, two binary multiplier data path components with alternate design architectures meeting timing may be saved for the same bit widths. If no further alternative design architecture exits, the one with the smallest area is selected as the optimized data path component in the data path cluster.

At process block 1508, with another alternative design architecture existing for the respective data path component, an operator builder is used to synthesize the another alternative design architecture for the respective data path component. The process then goes to block 1510.

At process block 1510, a determination is made if the slack in the alternate design architecture for the respective data path component is positive. If the slack in the alternate design architecture for the data path component is not positive (zero or negative), indicating the timing constraint was not met or just barely met without margin, the process loops back to block 1506. If the slack in the alternate design architecture for the respective data path component is positive, indicating the timing constraint was met with some margin, then the process goes to block 1512.

At process block 1512, a determination is made if the alternate design architecture for the respective data path component uses a smaller layout design area. If the layout design of the alternate design architecture for the respective data path component is not smaller, the process goes to block 1506 skipping process 1514. If the layout design of the alternate design architecture for the respective data path component is smaller, the process goes to block 1514.

At process block 1514, the alternate design architecture for the respective data path component with the smaller layout area is recorded so that it may be used later. The process then loops back to block 1506 where a determination is made if there are any further alternative design architectures for the respective data path components.

Super-Threading and Computer Systems

As mentioned previously, one of the characteristics of a super-builder is the rebuildability of the components that it synthesizes. The saved information and rebuildability of the super builder, enables the portability of architecture synthesis over a super-thread channel in a super-threading system.

To speed up architecture exploration, a synthesizer, acting as a master process, can send builder information as well as its environment over a super-thread channel to additional processors in a network. The additional processors, acting as slave processes, execute synthesis jobs in parallel to explore the various architectures of a data path cluster.

After circuit synthesis, circuit cells may be placed into a layout and the interconnect may be routed, generally referred to as a place and route process. After the place and route process (post place and route), the data paths may undergo refinement (post place and route data path refinement). With super-threading being used for synthesis, it may also be used for refining the data paths after the place and route process.

The super threading commands used for synthesis of the data path circuits are saved for used later for post place and route data path refinement. After the place and route process is finished, the wire delays in the data paths may be accurately estimated. The final netlist and parasitic information, along with the super builder and builder commands, are read into the synthesis tool.

The data path refinement process repeats a portion of the process of the flow chart illustrated in FIG. 13. The data path refinement process begins with process block 1330 and continues through to process block 1342. In this manner, the embodiments of the invention may be used for post place and route data path refinement.

Referring now to FIG. 16, a block diagram of a network of computer systems (an exemplary super-threading system) to synthesize an integrated circuit design is illustrated. Work scripts may be formed in one computer system to use a synthesize a portion of the integrated circuit design with an integrated circuit design program and may be shared over a network with other computer systems to synthesize blocks, elements, components, or sub-circuits of an integrated circuit design 150, in parallel in accordance with some embodiments of the invention.

In FIG. 16, block diagrams of computer systems 100B, 101A-101N are illustrated coupled together through a network 140. The computer systems 100B, 101A-101N may optionally be referred to as servers. A block diagram of the integrated circuit design 150 is also illustrated in FIG. 16 for correlation to processes being performed by the computer systems 100B, 101A-101N. The network 140 coupling the computer systems 100B, 101A-101N together may be a local area network (LAN), a wide area network (WAN), or a combination thereof. Each of the computer systems 100B, 101A-101N may include a copy of the integrated circuit design program 110 to execute if authorized by a license key mechanism. The integrated circuit design program 110 may support multiple threads of execution on a multi-processor computer system. Alternatively, the integrated circuit design program 110 may support multiple processes of execution across multiple computer systems with one or more processors.

Computer system 100B may act as a primary or master computer including a master process to generate work scripts that are shared over the network 140 to secondary or slave computer systems 101A-101N. One or more work scripts WS1 130A, WS 4 130D, WS5 130E may be sent out over the network 140 to the slave computer systems 101A-101N, for example. Other work scripts, WS2 130B, WS3 130C, and WSN 130N for example, may be executed by multiple processors 120A-120N in the master computer system 100B. With each of the computer systems 100B, 101A-101N having a copy of the integrated circuit design program 110, they may respectively synthesize the blocks, elements, components, or sub-circuits of the integrated circuit design 150 in response to the work scripts.

For some embodiments, each of the computer systems 100B, 101A-101N may have a copy of a synthesis program (not shown), and they may respectively perform circuit synthesis of data path clusters of the integrated circuit design 150 using master builders and super builders of the synthesis program.

Computer system 100B, acting as the master computer, may additionally include a static timing analysis program to determine delays of the circuits being synthesized and evaluate tradeoffs in the alternate designs that may be available.

The computer system 100B may further automatically perform the processes of the process described in FIGS. 12-15 in response to the synthesis program.

Additionally, each of the computer systems 100B, 101A-101N may have access to the standard cell library 104 to perform work on blocks, subcircuits, elements, or components of the integrated circuit design 150 in response to the work scripts. A shared file system, such as made available on the non-volatile storage 102, may be provided so that computer systems 100B, 101A-101N may access one or more libraries including the standard cell library. The master process generates an initialization script that may be sent to each and every slave process after being launched. The initialization script includes general IC design program settings and library settings including the location of the shared file system where every slave process can access a library or database to perform work or simulate the IC design 150.

Each of the computer systems 100B, 101A-101N may further include an operating system (OS) 115, one or more processors 120, and a volatile storage 125, such as memory and/or virtual memory. The computer system 100B may internally include a non-volatile storage 102, such as a hard drive, to form the computer system 100B'. Otherwise, the non-volatile storage 102 may be external and coupled to the computer system 100B or alternatively coupled to the network 140 as a networked attached storage device. The information stored in the non-volatile storage 102 is ordinarily not lost when the power is removed.

As discussed previously, the computer systems 100B, 101A-101N respectively perform work on blocks of the integrated circuit design 150 over the network 140 using a copy of the integrated circuit design program 110 in response to the work scripts 130A-103N. Allowing work on blocks of the integrated circuit design 150 to be divided up and spread across a network to the computer systems 100B, 101A-101N may be referred to as super-threading. In this case, the processes to perform work on the integrated circuit design 150 are spread across the network 140 from the master computer system 100B executing a master process to the slave computer systems 101A-101N executing slave processes. The master process in the computer system 100B may send work scripts out over the network 140 to the slave computer systems 101A-101N. For example, computer system 101A may execute the work script WS1 130A to work on block B1 160A of the integrated circuit design 150. Computer system 101B may execute the work script WS5 130E to work on block B5 160E of the integrated circuit design 150, and so on and so forth, to the Nth computer system 101N that may execute the work script WS4 130D to work on block B4 160D of the integrated circuit design 150.

For some embodiments, the computer systems 100B, 101A-101N may be used in a super-threading environment. Super-threading takes advantage of the larger memory capacity that is available today given the lower memory prices per megabyte. With super-threading, a copy of the IC design program 110 in a computer system is duplicated and loaded into memory for each processor within each computer system 100B, 101A-101N so that they can be independently executed with the work script without sharing memory. For example, the computer system 101B has two processors 120A-120B. Two copies of the IC design program 110 can be read into memory 125 of the computer system 101B to independently execute two work scripts using the two processors 120A-120B and perform work on two blocks of the integrated circuit design 150. The memory 125 may be split into two independent memory portions for the respective processors 120A-120B. That is, super-threading does not share memory space between processors so that the work can be independent and split up to be sent across a network to different computer systems. With the IC design work being split up into multiple processes to be performed by different computer systems or servers over the network, more work can be done in parallel by additional processors. Thus, the overall time for the IC design program 110 to perform work on the entire IC design 150 can be reduced by using super-threading.

CONCLUSION

When implemented in software, the processes of the embodiments of the invention are essentially the code segments to perform the necessary tasks. The program or code segments can be stored in a processor readable medium or transmitted by a computer data signal embodied in a carrier wave over a transmission medium or communication link. The "processor readable medium" may include any medium that can store information. Examples of the processor readable medium include an electronic circuit, a semiconductor memory device, a read only memory (ROM), a flash memory, an erasable programmable read only memory (EPROM), a floppy diskette, a CD-ROM, an optical disk, or a hard disk. The code segments may be downloaded via computer networks such as the Internet, Intranet, etc. and can propagate over a transmission medium such as electronic network channels, optical fibers, air, electromagnetic, RF links, etc. for storage into the "processor readable medium".

The embodiments of the invention are thus described. While embodiments of the invention have been particularly described, they should not be construed as limited by such embodiments. Instead the embodiments of the invention should be construed according to the claims that follow below.

What is claimed is:

1. A method of logic synthesis comprising:
with one or more processors,
generating a plurality of design architecture alternatives for circuit logic of a data path cluster with a super builder, wherein each of the plurality of design architecture alternatives includes a differing plurality of data path operators to provide a similar overall logical function for the data path cluster;
saving the plurality of design architecture alternatives for the circuit logic of the data path cluster;
rebuilding the circuit logic of the data path cluster by using stored original builder information of the plurality of design architecture alternatives in response to a different environment for the data path cluster; and
evaluating the plurality of design architecture alternatives for the circuit logic of the data path cluster with the super builder in response to a plurality of design constraints to select a preferred design architecture for the circuit logic of the data path cluster, wherein the evaluating includes comparing the plurality of design architectures for the circuit logic of the data path cluster.

2. The method of claim 1, wherein
the plurality of design architectures alternatives are evaluated for timing and area usage.

3. The method of claim 1, wherein
each of saved plurality of design architectures alternatives includes an operator builder array of one or more operators for the circuit logic of the data path cluster.

4. The method of claim 3, wherein
each operator in the operator builder array is generated by an operator builder.

5. The method of claim 4, wherein
the operator builder is one of a multiplier builder, a multiplexer builder, an adder builder, a carry-save-adder builder, a subtracter builder, or a shifter builder.

6. The method of claim 1, further comprising:
storing original builder information for each of the plurality of design architectures alternatives.

7. The method of claim 6, wherein
the stored original builder information includes logic type, input operands, output operands, bit-width, logical form, and connectivity of each operator in the circuit logic of the data path cluster.

8. The method of claim 1, further comprising:
optimizing the data path cluster in response to initial place and route information including
concurrently rebuilding a plurality of data path components in response to stored original builder information for each.

9. A hierarchical logic synthesis system for circuit synthesis of integrated circuits, the system comprising:
a processor,
and software stored in a processor readable medium including instructions that when executed by the processor provide
a master builder to synthesize an integrated circuit in response to a register-transfer level (RTL) netlist;
one or more super builders under control of the master builder to respectively synthesize one or more data path clusters in the integrated circuit, save a plurality of design architecture alternatives for circuit logic of a respective data path cluster, store original builder information for the plurality of design architectures alternatives, and re-synthesize the circuit logic of the respective data path cluster using the stored original builder information in response to a different environment for the respective data path cluster; and
one or more operator builders under control of the one or more super builders to synthesize one or more operators in each of the one or more data path clusters in the integrated circuit.

10. The system of claim 9, wherein
the stored original builder information includes logic type, input operands, output operands, bit-width, logical form, and connectivity of each operator in the circuit logic of the data path cluster.

11. A method of logic synthesis comprising:
identifying one or more data path components in a register-transfer level (RTL) netlist for an integrated circuit design;
determining original builder information for each of the one or more data path components;
with a processor, synthesizing first circuit logic for the one or more data path components in response to the original builder information with one or more respective data path component builders;
connecting the first circuit logic of synthesized data path components to a netlist;
detecting connected data path components in the RTL netlist to form one or more data path clusters; and
determining whether or not there are one or more alternate architecture implementations for circuit logic of the one or more data path clusters; and
re-synthesizing the circuit logic of the one or more data path clusters by using stored original builder information of alternate architecture implementations in response to a different environment for the one or more data path clusters.

12. The method of claim 11, further comprising:
responsive to alternate architecture implementations, forming a super builder for each alternate architecture implementation.

13. The method of claim 11, further comprising:
to re-synthesize the circuit logic to form each alternate architecture implementation,
saving one or more operator builders in an operator builder array,
saving connectivity of the operator builders in a net array, and
saving glue logic in a glue logic array.

14. The method of claim 13, further comprising:
levelizing the data path components in the one or more data path clusters into one or more levels between registers;
determining a timing environment for each data path component at the same level; and
searching for computing resources over a network to concurrently optimize the data path components of the one or more data path clusters in the respective one or more levels.

15. The method of claim 14, wherein
if super threading is enabled then
creating a communications channel for each slave processor over the network and sending an optimization process for each level to each slave processor;
concurrently optimizing the data path components in the one or more data path clusters in respective one or more levels using one or more slave processor; and
receiving optimization results over the communication channel from each slave processor and connecting the optimized data path components to the netlist;
else if super threading is disabled then
creating a fake communication channel for each process and sending an optimization process for each level to each one or more co-processors;
optimizing the data path components in the one or more data path clusters in respective one or more levels using the one or more co-processors; and
receiving optimization results over the fake communication channel from each co-processor and connecting the optimized data path components to the netlist.

16. The method of claim 13, further comprising:
levelizing the data path components in the one or more data path clusters into one or more levels between registers;
determining a timing environment for each data path component at the same level; and
optimizing the data path components in the one or more data path clusters.

17. The method of claim 16, wherein
the optimizing of the data path components in the one or more data path clusters includes
synthesizing the fastest data path components;
connecting the fastest data path components to the netlist;
analyzing the timing of the one or more data path clusters to determine if timing slack is positive, and
if timing slack is positive then
analyzing layout area of the alternate design architecture for the one or more data path clusters to determine if the layout area is smaller and if smaller then recording the data path components of the alternate design architecture as best alternative else repeating the synthesizing, the connecting and the analyzing for the best alternative architecture for alternative data path components in the one or more data path clusters;
and
if timing slack is negative then
determining if the timing slack is greater than a best timing slack and if so then recording data path components as a best alternative architecture for the one or more data path clusters else repeating the synthesizing, the connecting and the analyzing for the best alternative architecture for the one or more data path clusters.

18. The method of claim 16, wherein
a super element is a plurality of data path clusters optimized together.

19. The method of claim 17, wherein
the optimization of the one or more data path components includes
analyzing the timing of a first architecture of each of the one or more data path components to determine if timing slack is positive, and
if timing slack is zero or negative then using the first architecture of the data path component as the optimum design architecture for the respective data path component,
if timing slack is positive then
  determining if an alternative design architecture exists for each data path component with a positive slack and if not then use the smallest data path component as the optimum design architecture for the respective data path component,
  else if an alternative design architecture exists for the respective data path component then synthesizing the alternative design architecture for the respective data path component
analyze the timing of the alternative design architecture for the respective data path component to determine if timing slack is positive,
if timing slack is positive for the alternative design architecture then analyzing the layout area of the alternative design architecture to determine if layout area is smaller and if smaller then recording the smaller data path component and then repeat the determining to see if another alternative design architecture exists to search for a smaller layout design for each respective data path component, else if the layout area is not smaller then repeating the determining to see if there is another alternative design architecture to search for a smaller layout design for each respective data path component without recording the prior alternative design architecture for the respective data path component.

* * * * *